(12) United States Patent
Cho et al.

(10) Patent No.: US 6,252,228 B1
(45) Date of Patent: Jun. 26, 2001

(54) METHOD OF ANALYZING MORPHOLOGY OF BULK DEFECT AND SURFACE DEFECT ON SEMICONDUCTOR WAFER

(75) Inventors: Sung-hoon Cho; Tae-yeol Heo, both of Kyungki-do (KR)

(73) Assignee: Samsung Electronics Co., Ltd., Suwon-City (KR)

( * ) Notice: Subject to any disclaimer, the term of this patent is extended or adjusted under 35 U.S.C. 154(b) by 0 days.

(21) Appl. No.: 09/204,054

(22) Filed: Dec. 3, 1998

(30) Foreign Application Priority Data

Dec. 29, 1997 (KR) .................................................. 97-76789

(51) Int. Cl.⁷ .................................................. G01N 23/04
(52) U.S. Cl. ........................................ 250/307; 250/341.4
(58) Field of Search .................................. 250/307, 341.4

(56) References Cited

U.S. PATENT DOCUMENTS 5,422,498 * 6/1995 Nikawa et al. ........................ 257/48
5,534,698 * 7/1996 Ohshima et al. .................. 250/341.4
5,892,225 * 4/1999 Okihara ................................. 250/307

\* cited by examiner

*Primary Examiner*—Jack Berman
(74) *Attorney, Agent, or Firm*—Jones Volentine, L.L.C.

(57) ABSTRACT

A method of analyzing the morphology of bulk and surface defects on a semiconductor wafer includes: determining a location of the defects; marking an indication proximate the location; milling the wafer using the indication, to thereby make a specimen; and analyzing the specimen to obtain the defects' morphology. Bulk defects as deep 5–250 $\mu$m can be detected and surface defects as deep as 10 $\mu$m from the wafer's surface can be detected. Both morphology analyses preferably include using TEM (Transmission Electron Microscopy). The location determination for both defects preferably includes projecting a laser beam onto the wafer. By obtaining the morphology of the defects, the cause of failure due to the bulk defects and surface defects can accurately be investigated, increasing semiconductor devices' reliability.

21 Claims, 2 Drawing Sheets

METHOD OF ANALYZING MORPHOLOGY OF BULK DEFECT AND SURFACE DEFECT ON SEMICONDUCTOR WAFER

CROSS-REFERENCES TO RELATED APPLICATIONS

The present application claims priority under 35 U.S.C. §119 to Korean Patent Application No. 97-76789 filed on Dec. 29, 1997, the entire contents of which are hereby incorporated by reference.

BACKGROUND OF THE INVENTION

1. Field of the Invention

The present invention relates to an analysis of the morphology of a semiconductor wafer's bulk defect and surface defect.

2. Description of the Related Art

Generally speaking, a semiconductor device uses a wafer of Si crystal as its primary material. The device is fabricated through processes where several films are formed on the wafer and then patterned. The Si crystal wafer can be classified into various types according to the ways of growing its crystals. Recently, there has been chiefly used a wafer whose crystals are grown in Czochralski's method.

However, wafers may be formed with bulk defects or surface defects on them during the process of growing the crystals. To prevent in advance failures caused by those defects formed and present on the wafer itself during semiconductor device manufacture, an analysis of the defects is carried out. According to prior art, however, the morphology of the bulk defect or surface defect cannot be investigated precisely, although the analysis of their distribution or location is enabled. Due to this problem, the causes of failure occurring during semiconductor device manufacturing using wafers or produced from the semiconductor device are not found out exactly. The unattainable analysis of morphology of the bulk defect or surface defect existing within a wafer reduces the semiconductor device's reliability because it prevents the cause of the semiconductor device's failure from being examined.

SUMMARY OF THE INVENTION

Therefore, in order to overcome such drawbacks of the prior art, an objective of the present invention is to provide a precise analysis of the morphology of a bulk defect or a surface defect existing on a semiconductor wafer. This analysis allows the investigation failures caused by those defects and thus enhancing semiconductors' reliability.

To accomplish these and other objects, there is provided a method of analyzing the morphology of a bulk defect on a semiconductor wafer, including determining a location of a bulk defect existing on the wafer; marking an indication near a position where the bulk defect is present; milling the wafer using the indication, to thereby make a specimen with which the bulk defect's morphology can be analyzed; and analyzing the specimen to obtain the bulk defects' morphology.

The bulk defects whose morphology is to be analyzed may be present as deep as 5–250 $\mu$m from the wafer's surface.

The determination of the location of the bulk defect preferably includes cutting the wafer to form a section and the location of the bulk defect is represented as a combination of a coordinate of the depth from the section and a coordinate of the depth from the wafer's surface. The location of the bulk defect is preferably detected by projecting a laser beam perpendicularly to the surface and perpendicularly to the section of the wafer, using a BMD (Bulk Micro Defect) analyzer. The determination of the location preferably includes marking a preliminary indication for whichever coordinate is determined first and using the preliminary indication to control the projecting of the laser beam on the other coordinate.

The indication is preferably marked using a FIB (Focused Ion Beam). It is preferable that the wafer made as the specimen with which the bulk defects' morphology can be analyzed is milled with a FIB (Focused Ion Beam). Alternatively, before the milling, the wafer may be cut into a predetermined size including an area containing the bulk defect. Then the milling includes milling the predetermined size of the wafer preferably with a Focused Ion Beam.

The analysis of the bulk defects' morphology using the specimen is preferably carried out with a TEM (Transmission Electron Microscopy).

For another aspect of the present invention, there is provided an analysis of the morphology of a bulk defect on a semiconductor wafer, including: projecting a laser beam to a section of the wafer cut perpendicular to its surface, using a BMD analyzer that enables the location of the bulk defect existing in the wafer to be found out, to thereby detect how deep the bulk defect is placed from the section; projecting the laser beam perpendicular to the wafer's surface to thereby detect how deep the bulk defect is placed from the surface; marking an indication near a position where the bulk defect is present, with a FIB (Focused Ion Beam); milling the wafer using the FIB (Focused Ion Beam) at the reference of the indication, the wafer being made as the specimen with which the bulk defect's morphology can be analyzed; and analyzing the specimen using a Transmission Electron Microscopy to obtain the bulk defect's morphology.

For still another aspect of the present invention, there is provided an analysis of the morphology of surface defects on a semiconductor wafer, including: determining the location of a surface defect in the surface of the wafer; marking an indication near a position where the surface defects are present; milling the wafer using the indication, to thereby make a specimen with which the surface defect's morphology can be analyzed; and analyzing the specimen to obtain the surface defect's morphology.

The surface defect whose morphology is to be analyzed is preferably present within as deep a range as 10 $\mu$m from the wafer's surface. The location of the surface defect is preferably detected by projecting a laser to the wafer's surface at a predetermined angle using a BMD analyzer. It is preferable that the predetermined angle is between 10° and 30°. The indication is preferably marked using a FIB (Focused Ion Beam). The wafer made as the specimen with which the bulk defects' morphology can be analyzed is preferably milled with a FIB (Focused Ion Beam). Alternatively, before milling, the wafer may be cut into a predetermined size including an area containing the surface defect. The analysis of the surface defects' morphology using the specimen is preferably carried out with a Transmission Electron Microscopy.

For yet another aspect of the present invention, there is provided an analysis of the morphology of a surface defect on a semiconductor wafer, including: projecting a laser beam to the wafer's surface, using a BMD analyzer to thereby detect the location of the surface defect existing within 10 μm from the wafer's surface; marking an indication near a position where the surface defect is present, with a FIB (Focused Ion Beam); milling the wafer using the FIB (Focused Ion Beam) at the reference of the indication, the wafer being made as the specimen with which the surface defects' morphology can be analyzed; and analyzing the specimen using a Transmission Electron Microscopy to obtain the surface defect's morphology.

It is to be understood that both the foregoing general description and the following detailed description are exemplary and explanatory and are intended to provide further explanation of the invention as claimed.

BRIEF DESCRIPTION OF THE DRAWINGS

These and other features ofthe invention will be understood more clearly from the following description, read in conjunction with the drawings, in which.

DETAILED DESCRIPTION OF THE PREFERRED EMBODIMENT

Hereinafter, preferred embodiments of the present invention will be described in detail with reference to the attached drawings. The morphology analysis of a bulk defect existing within a wafer is regarded as the first embodiment. The morphology analysis of a surface defect existing from the surface of a wafer up to a predetermined depth is regarded as the second embodiment.

First Embodiment

Figure 1:
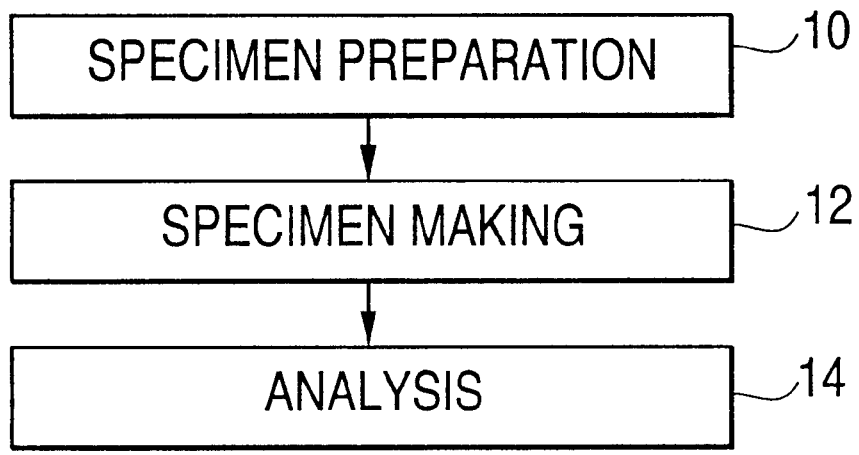
FIG. 1 is a process diagram of showing a morphology analysis of a bulk defect or a surface defect on a semiconductor wafer according to the present invention.

The first embodiment of the present invention for morphology analysis of a bulk defect existing in a wafer includes specimen preparation 10, specimen making 12, and analysis 14, as shown in FIG. 1.

First of all, the specimen preparation 10 is performed by determining the location of any bulk defects present in a wafer, and then marking a predetermined indication at a position near the location of the bulk defect. Here, this invention is able to analyze the morphology of bulk defects as deep as 5–250 μm from the wafer's surface. In the first embodiment, the morphology of bulk defects existing as deep as 200 μm can be examined. A BMD (Bulk Micro Defect) analyzer is employed to find out where the bulk defects are in the first embodiment of the present invention.

The detection of the location of bulk defects using the BMD analyzer is performed by image processing using an infrared (IR) camera with a laser diode. Specifically, the location of a bulk defect can be found out in combination of the X-axis coordinate and the Y-axis coordinate of a position detected by projecting a laser beam perpendicularly to the surface of a wafer and then projecting a laser beam perpendicularly to a section of the wafer which has been made into a specimen, which enables the bulk defects' morphology to be analyzed using the BMD analyzer.

Figure 2:
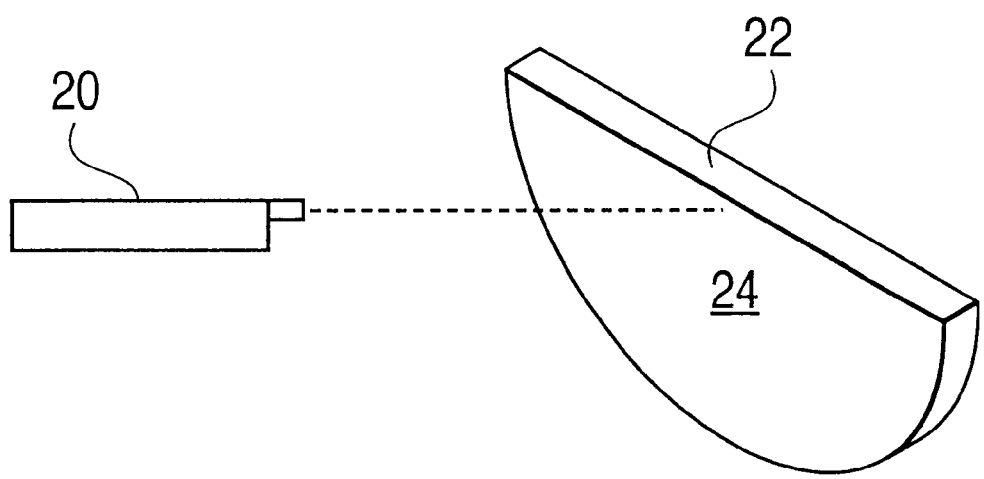
FIGS. 2 and 3 are layouts of the first embodiment of the present invention for finding the location of a bulk defect on a semiconductor wafer.
Figure 3:
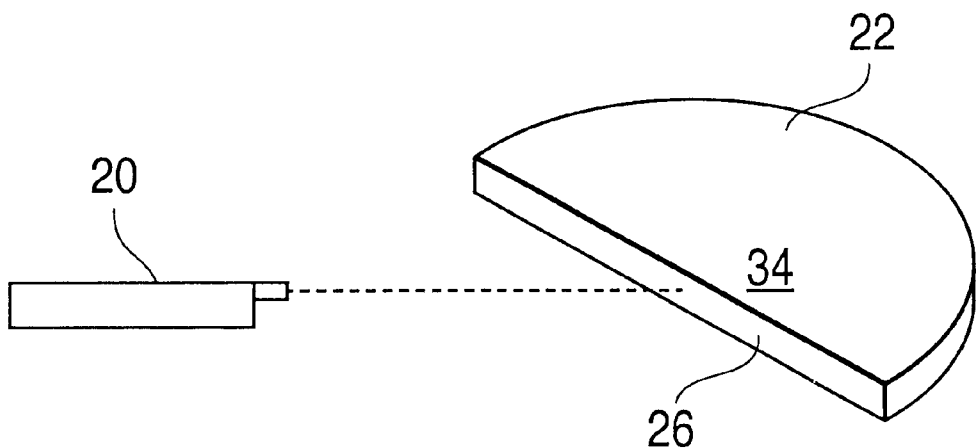

As shown in FIG. 2, a laser diode 20 is used to project a laser beam perpendicularly to the surface 24 of wafer 22 so that the location of a bulk defect can be detected from the surface 24 of wafer 22. As shown in FIG. 3, the laser beam is also projected perpendicularly to the section 26 of wafer 22 using the laser diode 20 so that the location of the bulk defect can be discovered from the section 26 of wafer 22. By combining the coordinates at the locations from the surface 24 and from the section 26, the exact position of the bulk defect is determined.

Here, in the first embodiment of the present invention, a predetermined indication can be marked on the surface 24 ofthe wafer 22 when the location of the bulk defect from the surface is detected. Using this indication, the location of the bulk defect from the wafer's section 26 is detected to finally mark another indication at a position near the bulk defect. These indications are preferably made with a FIB (Focused Ion Beam). The FIB can create markings as wide as 2–3 μm, as long as 4–6 μm, and as deep as 2–4 μm, from the surface of the wafer 22.

In order to form a specimen with which the morphology of the bulk defects detected in the specimen preparation 10 can be analyzed in step 14, the area of the specimen having the bulk defects may be cut in a predetermined size. Alternatively, the wafer itself can be used as the specimen. This specimen with which the bulk defects' morphology can be analyzed may be made by milling the wafer up to the position where the bulk defects' morphology can be analyzed. The wafer is preferably milled by the FIB.

The subsequent analysis step 14 in the first embodiment preferably is performed with a TEM (Transmission Electron Microscopy), so the specimen should be made for use the TEM. It would be obvious for the skilled in the art to fully consider a charge accumulation frequently occurring in the analysis using TEM or the thickness of the specimen. Therefore, a person who understands the spirit of the present invention can easily fabricate the specimen with which the bulk defects can be analyzed using the TEM. With this specimen, the analysis step 14 of examining the bulk defects' morphology is performed. Here, the analysis step 14 uses the TEM in the first embodiment of the present invention.

Thus, this embodiment includes steps in which the location of the bulk defect existing in the wafer is detected, the specimen with which the bulk defects' morphology can be analyzed is made, and then the bulk defects' morphology is analyzed. In this embodiment, the cause of failure due to the bulk defects is exactly investigated because the bulk defects' morphology can be analyzed.

Second Embodiment

This embodiment is designed to analyze the morphology of the surface defects existing up to a predetermined depth from the wafer's surface. Similar to the first, the second embodiment is composed of a specimen preparation step 10, a specimen making step 12, and an analysis step 14, as in FIG. 1.

The specimen preparation step 10 is performed by finding out the location of the surface defects existing at a predetermined depth from the wafer's surface, and then marking an indication at a position near the surface defects. The surface defects whose morphology can be analyzed in this invention exists within 10 μm from the wafer's surface. In this second embodiment, the morphology of the surface defects present as deep as 5 μm is analyzed.

Figure 4:
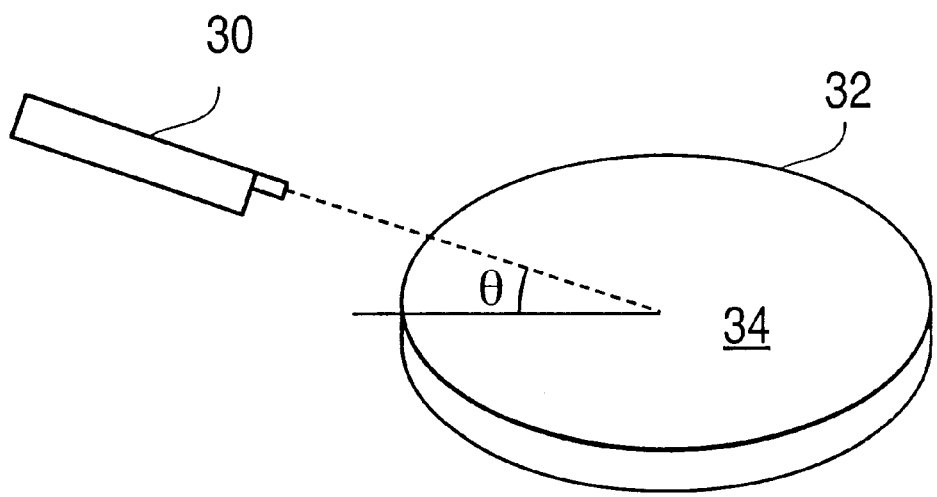
FIG. 4 is a layout of the second embodiment of the present invention for finding the location of a surface defect on a semiconductor wafer.

The location of the surface defects is detected with the BMD analyzer in the second embodiment, as in the first embodiment. However, using the BMD analyzer in the second embodiment includes projecting a laser beam from a laser 30 at a predetermined angle θ to a surface 34 of a wafer 32 serving as a specimen with which the surface defects' morphology can be analyzed. Preferably, the predetermined angle at which the laser beam is projected is within 10–30° from the wafer's surface. In this embodiment, the laser is irradiated at 24.5°. As shown in FIG. 4, the laser diode 30 is used to project a laser beam at a predetermined angle θ to the surface 34 of the wafer 32 so that the location of any surface defects existing on the wafer 32 is detected.

The present invention performs the detection of the locations of bulk defects and surface defects individually according to the range of angles within which the laser is projected. This range depends just upon the classification of image processing capability using the BMD analyzer that can detect the location of bulk defects or surface defects.

In the second embodiment, a predetermined indication can be marked at a position near which the surface defects exist after the detection of the location of the surface defects present in the wafer. This indication is preferably made using the FIB as in the first embodiment and is of a similar size as in the first embodiment.

In order to make a specimen with which the morphology of the surface defects detected in the specimen preparation can be analyzed, the area where the surface defects exist is cut in a predetermined size as in the first embodiment, or the wafer itself may be used as the specimen.

The specimen with which the surface defects's morphology can be analyzed is made by milling the wafer up to the position where the surface defects' morphology can be analyzed. The wafer is preferably milled using the FIB as the specimen which enables the surface defects' morphology to be analyzed.

The subsequent analysis step 14 in the second embodiment is preferably performed with TEM (Transmission Electron Microscopy), so the specimen should be formed for use with the TEM. Therefore, a person who understands the spirit of the present invention can easily fabricate the specimen with which the surface defects can be analyzed using the TEM. It would be obvious for the skilled in the art to fully consider charge accumulation frequently occurring in the analysis using TEM or the thickness of the specimen. With this specimen, the analysis step 14 of examining the surface defects' morphology is performed. Here, the analysis uses the TEM in the second embodiment of the present invention.

This embodiment consists of the steps in which the location of the surface defect existing in the wafer is detected, the specimen with which the surface defects' morphology can be analyzed is made, and then the surface defects' morphology is analyzed. In this embodiment the cause of failure due to the surface defects is exactly investigated because the surface defects' morphology can be analyzed.

From now on, the operation and effect of the embodiments of the present invention made as above will be explained. For the analysis of the bulk defects, the first embodiment is taken, and for the surface defects, the second embodiment.

First Embodiment

For an easier detection of the location of the bulk defects existing in the wafer 22, the wafer 22 is cut perpendicular to the surface 24, and then loaded on the BMD analyzer. The cut wafer is loaded on the BMD analyzer perpendicular to the surface 24, and a laser beam from the laser 20 is incident on the surface 24 of wafer 22. The laser beam is also perpendicular to the surface 24, as shown in FIG. 2, for the detection of the location of bulk defects from the surface. Here, an indication may be marked near a position where the bulk defects are detected.

The wafer 22 is then loaded so that its surface 24 is placed horizontal in the BMD analyzer, and the laser beam is incident on the section 26 of wafer 22, perpendicular thereto, as shown in FIG. 3. The other coordinate of the bulk defects are thereby determined from the section 26. An indication may be marked near a position where the bulk defects are detected. The location of the bulk defects is determined from the surface 24 and the section 26 of the wafer 22, and is expressed as a combination of coordinates of the X-axis and Y-axis. The wafer 22 may be loaded first for the detection of the location at the section 26.

After the detection of the location of the bulk defects, the wafer is milled to make a specimen which can be used to analyze the bulk defects' morphology. The specimen may be formed by cutting the area where the bulk defects exist in a predetermined size, or from the wafer itself. The specimen may be made in consideration of the analyzer to be used in the subsequent analysis step. In the first embodiment, the specimen can be formed such that the morphology of the bulk defects can be analyzed with the TEM. The bulk defects' morphology can be analyzed using the TEM and the specimen made in the specimen making step 12. With the analysis of the morphology of the bulk defects existing in the wafer, the cause of failure due to the bulk defects can be investigated accurately.

Second Embodiment

First of all, the wafer 32 is loaded on the BMD analyzer so that the location of the surface defects existing on the surface 34 of the wafer 32 can be detected. The wafer 32 is loaded while in the BMD with its surface 34 horizontal. As shown in FIG. 4, the location of the surface defects is determined when a laserbeam is projected from the laser at a predetermined angle θ, e.g., 24.5°, to the surface 34 of the wafer 32. An indication may be marked near a position where the surface defects are detected.

After the detection of the location of the surface defects, the wafer 32 is milled to serve as a specimen which enables the surface defects' morphology to be analyzed. The specimen may be formed by cutting the area where the surface defects exist in a predetermined size, or from the wafer itself. The specimen may be made in consideration of the analyzer to be used in the subsequent analysis step. In the second embodiment, the specimen can be formed for use with the TEM. The surface defects' morphology can be analyzed using the TEM and the specimen made in the specimen making step 14 that enables the surface defects' morphology to be analyzed. With the analysis of the morphology of the surface defects existing in the wafer, the cause of failure due to the surface defects can be investigated accurately.

In conclusion, the present invention enables the analysis of the morphology of the bulk defects and surface defects present in the wafer to be performed easily so that the cause of failure due to those defects can be examined precisely. Accordingly, this enhances the reliability of semiconductor devices.

The term "near" as used throughout means "proximate" such that an indication formed near the location of the defect may be used for subsequent milling of the wafer to form a sample for use in analyzing the morphology of the defect. Since the distance of the defect from the coordinates of the indication is known, the indication may be used to control the subsequent milling of the wafer.

It will be apparent to the reader that the foregoing description of the invention has been presented for purposes of illustration and description and for providing an understanding of the invention and that many changes and modifications can be made without departing from the scope of the invention. It is therefore intended that the scope of the invention be indicated by the appended claims rather than by the foregoing description; and all changes which come within the meaning and range of equivalency of the claims are therefore intended to be embraced therein.

What is claimed is:

1. A method of analyzing the morphology of a bulk defect on a semiconductor wafer on which semiconductor devices are to be formed, comprising:

determining a location of a bulk defect existing on the wafer;

marking an indication proximate a position where the bulk defect is present;

milling the wafer using the indication, to thereby make a specimen with which the bulk defect's morphology can be analyzed; and analyzing the specimen to obtain the bulk defect's morphology.

2. The method of analyzing the morphology of a bulk defect on a semiconductor wafer as claimed in claim 1, wherein the bulk defect whose morphology is to be analyzed is present from as shallow as 5 μm to as deep as 250 μm from a surface of the wafer.

3. The method of analyzing the morphology of a bulk defect on a semiconductor wafer as claimed in claim 1, further comprising cutting the wafer to form a section, and wherein the location of the bulk defect is represented as a combination of a coordinate of the depth from the section and a coordinate of the depth from the wafer's surface.

4. The method of analyzing the morphology of a bulk defect on a semiconductor wafer as claimed in claim 3, wherein said determining the location of the bulk defect includes projecting a laser beam perpendicularly to the surface and perpendicularly to the cut section of the wafer, using a BMD (Bulk Micro Defect) analyzer.

5. The method of analyzing the morphology of a bulk defect on a semiconductor wafer as claimed in claim 4, further comprising marking a preliminary indication for whichever coordinate is determined first and using said preliminary indication to control the projecting of the laser beam on the other coordinate.

6. The method of analyzing the morphology of a bulk defect on a semiconductor wafer as claimed in claim 5, wherein said marking the preliminary indication includes using a Focused Ion Beam.

7. The method of analyzing the morphology of a bulk defect on a semiconductor wafer as claimed in claim 1, wherein said marking the indication includes using a Focused Ion Beam.

8. The method of analyzing the morphology of a bulk defect on a semiconductor wafer as claimed in claim 1, wherein said milling includes milling the wafer with a Focused Ion Beam.

9. The method of analyzing the morphology of a bulk defect on a semiconductor wafer as claimed in claim 1, further comprising, before said milling, cutting the wafer into a predetermined size including an area containing the bulk defect.

10. The method of analyzing the morphology of a bulk defect on a semiconductor wafer as claimed in claim 9, wherein said milling includes milling the predetermined size of the wafer with a Focused Ion Beam.

11. The method of analyzing the morphology of a surface defect on a semiconductor wafer as claimed in claim 9, wherein said determining the location includes projecting a laser to the surface of the wafer at a predetermined angle using a BMD analyzer.

12. The method of analyzing the morphology of a surface defect on a semiconductor wafer as claimed in claim 11, wherein the predetermined angle is between 10° and 30°.

13. The method of analyzing the morphology of a bulk defect on a semiconductor wafer as claimed in claim 1, wherein said analyzing includes using a TEM (Transmission Electron Microscopy).

14. A method of analyzing the morphology of a bulk defect on a semiconductor wafer on which semiconductor devices are to be formed, comprising:

projecting a laser beam onto a section of the wafer cut perpendicular to a surface of the wafer, using a BMD analyzer that enables the location of the bulk defect existing in the wafer to be determined, to thereby detect how deep the bulk defect is from the section;

projecting the laser beam projected perpendicular to the surface of the wafer to thereby detect how deep the bulk defect is from the surface; and marking an indication proximate a position where the bulk defect is present, with a FIB (Focused Ion Beam);

milling the wafer using the FIB (Focused Ion Beam) at the reference of the indication, the wafer being made as the specimen with which the bulk defect's morphology can be analyzed; and analyzing the specimen using (Transmission Electron Microscopy) TEM to obtain the bulk defect's morphology.

15. A method of analyzing the morphology of a surface defect on a semiconductor wafer on which semiconductor devices are to be formed, comprising:

determining a location of the surface defect within a certain depth from a surface of the wafer;

marking an indication proximate a position where the surface defect is present;

milling the wafer using the indication, to thereby make a specimen with which the surface defect's morphology can be analyzed; and analyzing the specimen to obtain the surface defect's morphology.

16. The method of analyzing the morphology of a surface defect on a semiconductor wafer as claimed in claim 15, wherein the surface defect whose morphology is to be analyzed is present within as deep a range as 10 μm from the surface of the wafer.

17. The method of analyzing the morphology of a surface defect on a semiconductor wafer as claimed in claim 15, wherein said marking the indication includes using a FIB (Focused Ion Beam).

18. The method of analyzing the morphology of a surface defect on a semiconductor wafer as claimed in claim 15, wherein said milling the wafer includes using a FIB (Focused Ion Beam).

19. The method of analyzing the morphology of a surface defect on a semiconductor wafer as claimed in claim 15, wherein the analyzing includes using Transmission Electron Microscopy.

20. The method of analyzing the morphology of a surface defect on a semiconductor wafer as claimed in claim 15, further comprising, before said milling, cutting the wafer into a predetermined size including an area containing the surface defect.

21. A method of analyzing the morphology of a surface defect on a semiconductor wafer on which semiconductor devices are to be formed, comprising:

projecting a laser beam onto a surface of the wafer using a BMD analyzer to thereby detect a location of the surface defect existing within 10 $\mu$m from the surface of the wafer;

marking an indication proximate a position where the surface defect is present with a FIB (Focused Ion Beam);

milling the wafer using the FIB (Focused Ion Beam) at the reference of the indication, the wafer being made as the specimen with which the surface defect's morphology can be analyzed; and analyzing the specimen using and a Transmission Electron Microscopy to obtain the surface defect's morphology.

* * * * *